US012619550B2

(12) United States Patent
Subbarao

(10) Patent No.: US 12,619,550 B2
(45) **Date of Patent: *May 5, 2026**

(54) STORING A LOGICAL-TO-PHYSICAL MAPPING IN NAND MEMORY

(71) Applicant: Micron Technology, Inc., Boise, ID (US)

(72) Inventor: Sanjay Subbarao, Irvine, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/893,262

(22) Filed: Sep. 23, 2024

(65) Prior Publication Data

US 2025/0013579 A1    Jan. 9, 2025

Related U.S. Application Data

(63) Continuation of application No. 18/223,843, filed on Jul. 19, 2023, now Pat. No. 12,124,380, which is a
(Continued)

(51) Int. Cl.
*G06F 12/10* (2016.01)
*G06F 12/0815* (2016.01)
(Continued)

(52) U.S. Cl.
CPC ...... *G06F 12/1009* (2013.01); *G06F 12/0815* (2013.01); *G11C 16/0483* (2013.01);
(Continued)

(58) Field of Classification Search
CPC .. G06F 12/10; G06F 12/1009; G06F 12/1045; G06F 12/0815; G06F 12/123;
(Continued)

(56) References Cited

U.S. PATENT DOCUMENTS

| | | | |
|---|---|---|---|
| 11,734,189 B2 | 8/2023 | Subbarao |
| 11,755,495 B2 | 9/2023 | Subbarao |

(Continued)

FOREIGN PATENT DOCUMENTS

| | | |
|---|---|---|
| CN | 103176752 A | 6/2013 |
| CN | 104731523 | 6/2015 |

(Continued)

OTHER PUBLICATIONS

U.S. Appl. No. 18/899,895, filed Sep. 27, 2024, Caching of Logical-to-Physical Mapping Information in a Memory Sub-System.

(Continued)

*Primary Examiner* — Tracy C Chan
(74) *Attorney, Agent, or Firm* — Schwegman Lundberg & Woessner, P.A.

(57) ABSTRACT

A processing device receives a request specifying a logical address associated with a host-initiated operation directed at a first portion of a memory device. The processing device accesses a second L2P table comprising a mapping between logical addresses and physical addresses in a second portion of the memory device. A physical location within the second portion of the memory device is identified based on the second L2P table. The physical location corresponds to a portion of a first L2P table that specifies a physical address within the first portion of the memory device that corresponds to the logical address. The physical address is identified based on the portion of the first L2P table and the host-initiated operation is performed at the physical address.

20 Claims, 8 Drawing Sheets

Related U.S. Application Data continuation of application No. 17/202,983, filed on Mar. 16, 2021, now Pat. No. 11,755,495.

(51) Int. Cl.

| | |
|---|---|
| *G06F 12/1009* | (2016.01) |
| *G11C 16/04* | (2006.01) |
| *G11C 11/56* | (2006.01) |
| *G11C 14/00* | (2006.01) |

(52) U.S. Cl.

CPC ...... *G06F 2212/7201* (2013.01); *G11C 11/56* (2013.01); *G11C 14/0018* (2013.01)

(58) Field of Classification Search

CPC ......... G06F 12/0246; G06F 2212/7201; G06F 2212/7205; G06F 2212/69; G06F 2212/466; G11C 16/0483; G11C 11/56; G11C 14/0018

See application file for complete search history.

(56) References Cited

U.S. PATENT DOCUMENTS

| | | | | |
|---|---|---|---|---|
| 12,130,748 | B2 | 10/2024 | Subbarao | |
| 2004/0117600 | A1* | 6/2004 | Bodas | H04L 69/161 |
| | | | | 712/210 |
| 2006/0179212 | A1* | 8/2006 | Kim | G06F 12/0246 |
| | | | | 711/E12.008 |
| 2007/0300037 | A1 | 12/2007 | Rogers et al. | |
| 2009/0193184 | A1 | 7/2009 | Yu et al. | |
| 2012/0297118 | A1* | 11/2012 | Gorobets | G06F 3/0679 |
| | | | | 711/E12.008 |
| 2014/0181375 | A1* | 6/2014 | Miyamoto | G06F 12/0868 |
| | | | | 711/103 |
| 2015/0039907 | A1* | 2/2015 | Bowden | G06F 16/211 |
| | | | | 711/125 |
| 2015/0127889 | A1* | 5/2015 | Hwang | G06F 12/0253 |
| | | | | 711/103 |
| 2015/0379682 | A1 | 12/2015 | Golas et al. | |
| 2017/0024326 | A1 | 1/2017 | Luo et al. | |
| 2017/0090794 | A1 | 3/2017 | Huang | |
| 2019/0114272 | A1 | 4/2019 | Dubey et al. | |
| 2019/0339904 | A1* | 11/2019 | Myran | G06F 3/0688 |
| 2020/0004455 | A1* | 1/2020 | Williams | G06F 12/0246 |
| 2020/0034299 | A1 | 1/2020 | Lee | |
| 2020/0057692 | A1 | 2/2020 | Payet et al. | |
| 2021/0073139 | A1* | 3/2021 | Sheridan | G06F 12/0646 |
| 2022/0129189 | A1* | 4/2022 | Zhou | G06F 12/06 |
| 2022/0292015 | A1* | 9/2022 | Klimov | G06F 21/64 |
| 2022/0300431 | A1 | 9/2022 | Subbarao | |
| 2022/0300432 | A1 | 9/2022 | Subbarao | |
| 2023/0359568 | A1 | 11/2023 | Subbarao et al. | |
| 2023/0367719 | A1 | 11/2023 | Subbarao | |
| 2025/0021488 | A1 | 1/2025 | Subbarao | |

FOREIGN PATENT DOCUMENTS

| | | |
|---|---|---|
| CN | 110998550 | 4/2020 |
| CN | 111831581 | 10/2020 |
| CN | 115080458 A | 9/2022 |
| CN | 115145838 A | 10/2022 |

OTHER PUBLICATIONS

"Chinese Application Serial No. 202210251626.4, Office Action mailed Mar. 25, 2025", with English translation, 27 pages.

"Chinese Application Serial No. 202210251626.4, Response filed Jul. 23, 2025 to Office Action mailed Mar. 25, 2025", w/ English Claims, 25 pgs.

"Chinese Application Serial No. 202210251922.4, Office Action mailed Jun. 6, 2025", with English translation, 31 pages.

"Chinese Application Serial No. 202210251626.4, Office Action mailed Aug. 14, 2025", with manual English translation, 43 pages.

"U.S. Appl. No. 18/899,895, Response filed Oct. 27, 2025 to Non Final Office Action mailed Sep. 10, 2025", 3 pages.

"Chinese Application Serial No. 202210251922.4, Office Action mailed Oct. 23, 2025", with English translation, 30 pages.

"Chinese Application Serial No. 202210251922.4, Response filed Sep. 22, 2025 to Office Action mailed Jun. 6, 2025", with English claims, 26 pages.

"Chinese Application Serial No. 202210251626.4, Response filed Nov. 21, 2025 to Office Action mailed Aug. 14, 2025", with English claims, 13 pages.

"Chinese Application Serial No. 202210251922.4, Decision of Rejection mailed Feb. 5, 2026", with manual English translation, 31 pages.

"Chinese Application Serial No. 202210251922.4, Response filed Nov. 21, 2025 to Office Action mailed Oct. 23, 2025", with English claims, 22 pages.

Zhiyoug, et al., "CAST: A page-level FTL with compact address mapping and parallel data blocks", (Jan. 10, 2023), 13 pgs.

* cited by examiner

400

405

RECEIVE REQUEST SPECIFYING A LOGICAL ADDRESS ASSOCIATED WITH A DATA OPERATION DIRECTED AT A MEMORY DEVICE

410

IDENTIFY PHYSICAL ADDRESS CORRESPONDING TO LOGICAL ADDRESS

415

PERFORM DATA OPERATION AT PHYSICAL LOCATION IN MEMORY DEVICE CORRESPONDING TO PHYSICAL ADDRESS

400

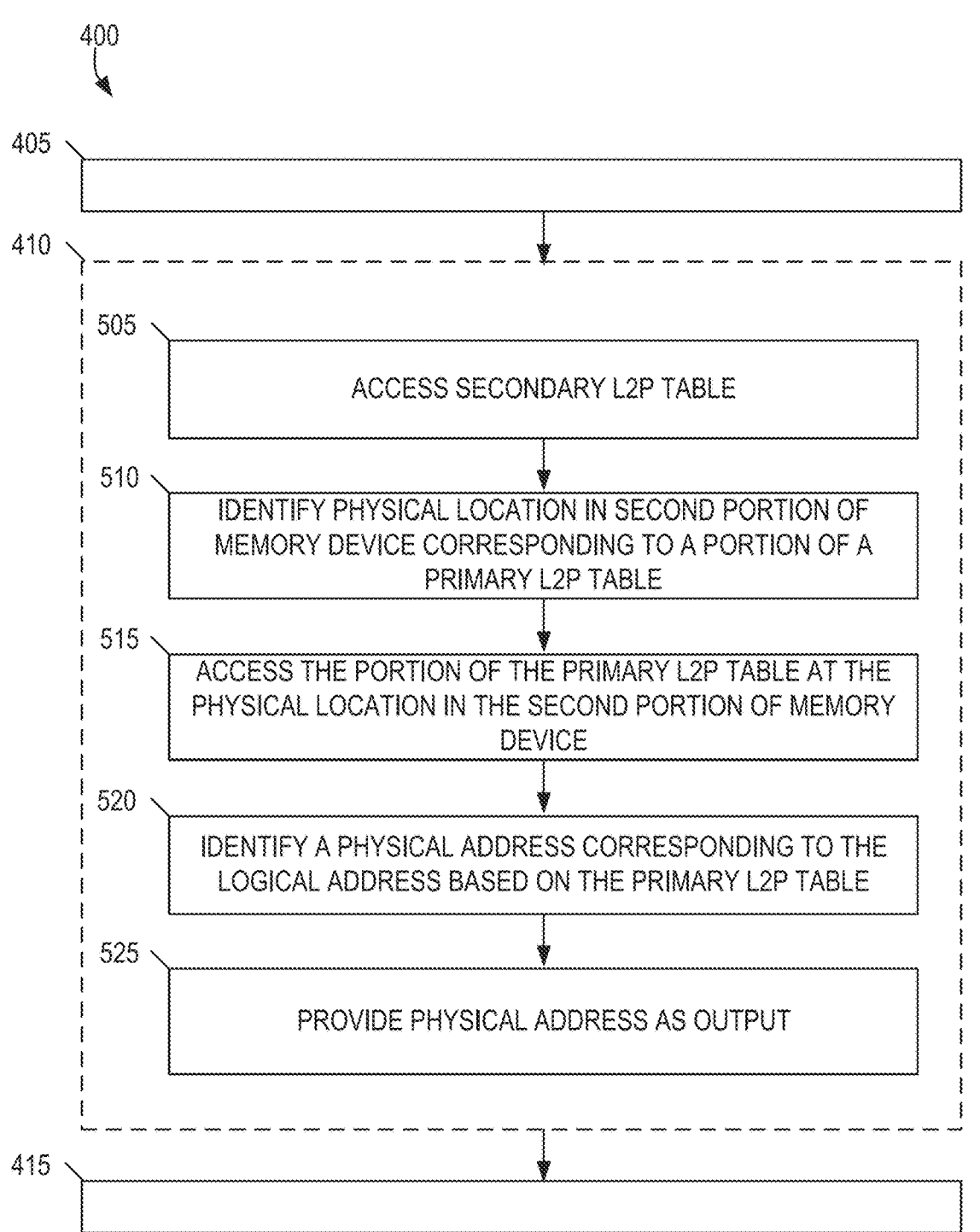

405

410

505 ACCESS SECONDARY L2P TABLE

510 IDENTIFY PHYSICAL LOCATION IN SECOND PORTION OF MEMORY DEVICE CORRESPONDING TO A PORTION OF A PRIMARY L2P TABLE

515 ACCESS THE PORTION OF THE PRIMARY L2P TABLE AT THE PHYSICAL LOCATION IN THE SECOND PORTION OF MEMORY DEVICE

520 IDENTIFY A PHYSICAL ADDRESS CORRESPONDING TO THE LOGICAL ADDRESS BASED ON THE PRIMARY L2P TABLE

525 PROVIDE PHYSICAL ADDRESS AS OUTPUT

STORING A LOGICAL-TO-PHYSICAL MAPPING IN NAND MEMORY

PRIORITY APPLICATION

This application is a continuation of U.S. application Ser. No. 18/223,843, filed Jul. 19, 2023, which is a continuation of U.S. application Ser. No. 17/202,983, filed Mar. 16, 2021, now issued as U.S. Pat. No. 11,755,495, all of which are incorporated herein by reference in their entirety.

TECHNICAL FIELD

Embodiments of the disclosure relate generally to memory sub-systems and, more specifically, to storing and using a logical-to-physical (L2P) mapping for a memory sub-system in a NAND memory device.

BACKGROUND

A memory sub-system can include one or more memory devices that store data. The memory components can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIGS. 4-6 are flow diagrams illustrating an example method for utilizing a logical to physical (L2P) table stored in a dedicated portion of a NAND memory device, in accordance with some embodiments of the present disclosure.

DETAILED DESCRIPTION

Figure 1:
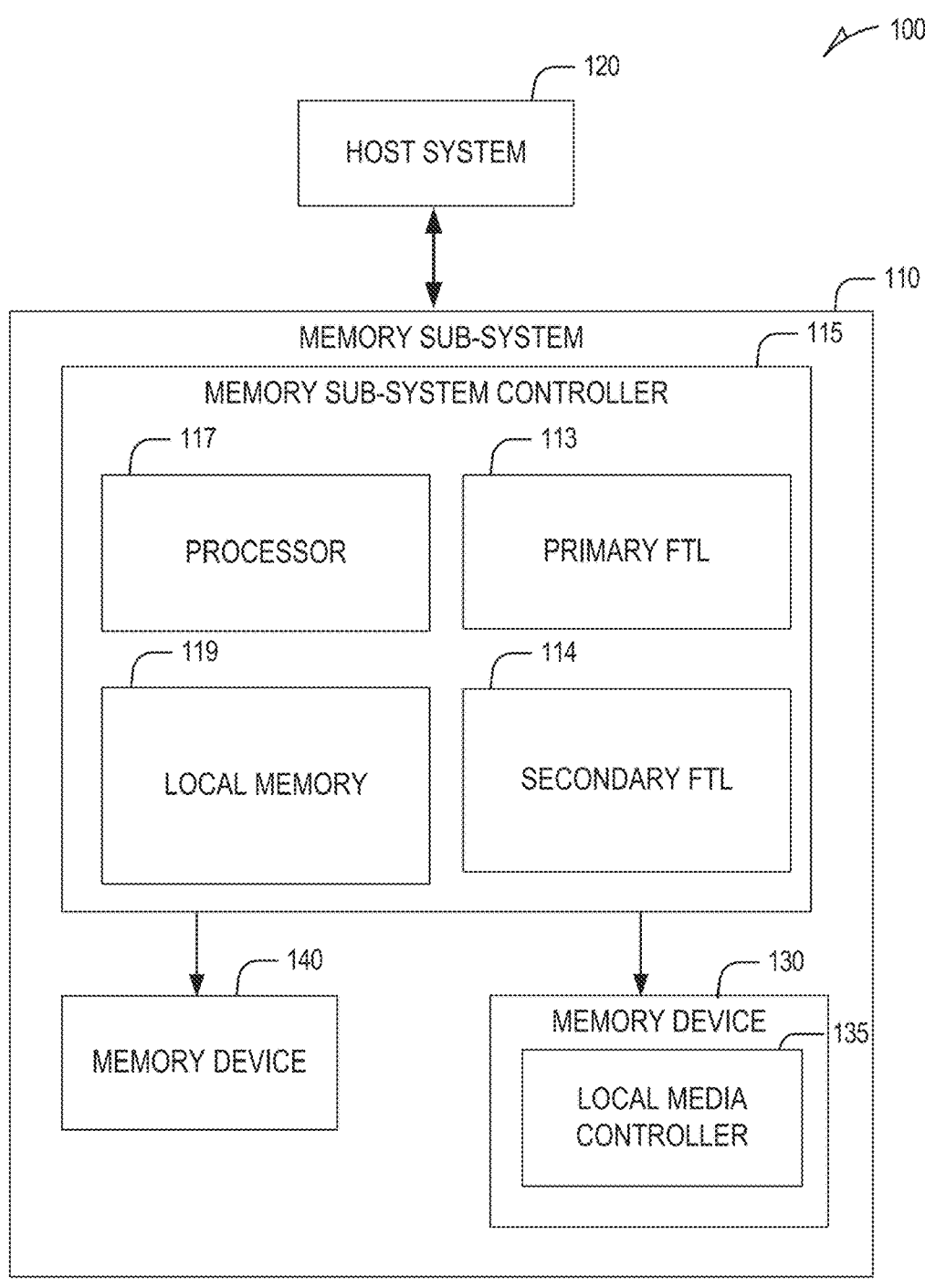
FIG. 1 is a block diagram illustrating an example computing environment that includes a memory sub-system, in accordance with some embodiments of the present disclosure.

Aspects of the present disclosure are directed to using and storing a logical-to-physical (L2P) map for a memory sub-system in a NAND memory device. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

Data operations can be performed by the memory sub-system. The data operations can be host-initiated operations.

For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system.

A memory device can be a non-volatile memory device. One example of a non-volatile memory device is a negative- and (NAND) memory device. Other examples of non-volatile memory devices are described below in conjunction with FIG. 1. Some memory devices, such as NAND memory devices, include an array of memory cells (e.g., flash cells) to store data. Each cell includes a transistor, and within each cell, data is stored as the threshold voltage of the transistor. More specifically, the range of threshold voltages of a transistor can be divided into multiple regions with each region corresponding to a charge level that decodes into a data value. Memory cells in these devices can be grouped as pages that can refer to a logical unit of the memory device used to store data. One type of memory cell, for example, single level cells (SLC), can store one bit per cell. Other types of memory cells, such as multi-level cells (MLCs), triple level cells (TLCs), quad-level cells (QLCs), and penta-level cells (PLCs) can store multiple bits per cell. A memory device can include one or more arrays of SLCs, MLCs, TLCs, QLCs, or any combination of such.

Within the context of a memory sub-system, a physical address identifies a physical location of data in a memory device. A logical address is a virtual address that is used by the host system as a reference to access a data unit corresponding to a physical location in the memory device. The data unit may correspond to a block, a page, or a sub-page. The memory sub-system maintains a logical to physical (L2P) table (also referred to as a "data map") to process access requests received from the host system. The L2P table includes a mapping between physical addresses and logical addresses. Traditionally, an L2P table is stored in a dynamic random-access memory (DRAM) component of the memory sub-system.

NAND cell densities within memory devices are increasing at a high rate, which increases the number of physical memory locations in the device. With an increasing number of physical memory locations comes an increasing size for the L2P table, which necessitates an increased DRAM size requirement to be able to store the larger L2P table. However, despite the steady increase in NAND cell density, DRAM densities remain relatively stable in part because a larger number of DRAM components can make the hardware layout infeasible, in addition to increasing the complexity of the DRAM interface with the memory sub-system controller.

Conventional approaches to address the increasing size of the L2P table include increasing a mapping indirection size unit (e.g., from 4 KB to 8-16 KB) to reduce DRAM requirements for storing the L2P table. However, this approach often results in increased write amplification. Another conventional approach includes using paging to page sections of the L2P table from flash memory to DRAM. However, this approach causes excessive flush rates to flash due to updates to the L2P table. This approach also increases the amount of flash memory utilized by flash translation layer (FTL) metadata, which can result in performance and endurance losses compared to the other approach.

Aspects of the present disclosure address the issue of large L2P table sizes in memory sub-systems by utilizing a NAND memory device to store the L2P table. A portion of the NAND memory device is dedicated for storing primary L2P data while remaining portions are used to store user data. For example, the L2P table can be stored in an SLC portion of the memory device while user data is stored in a QLC portion. In addition to a primary Flash Translation Layer that uses a conventional indirection unit size (e.g., 4 KB), the memory sub-system further includes a secondary fine granularity FTL with a reduced indirection unit size (e.g., 256 bytes instead of 4 KB) that works in conjunction with the primary FTL to process host-initiated operations. In executing look-ups, the secondary FTL uses a secondary L2P table (e.g., stored in DRAM) to identify physical locations with the dedicated portion where pertinent portions of the primary L2P table are stored. The secondary FTL accesses the pertinent portions of the primary L2P table from the dedicated portion (e.g., the SLC portion) to identify physical addresses that correspond to logical addresses to which host commands are directed. The primary FTL, in turn, executes host-initiated operations at the identified physical addresses.

In some embodiments, the memory sub-system can include a read cache (e.g., in DRAM) for the primary L2P table for restricted locality workloads. The read cache is managed in multiple chunks and each chunk stores a portion of the primary L2P table. The size of each chunk corresponds to the indirection unit size used by the secondary FTL. In the event of a cache miss, the secondary FTL accesses a physical location within the dedicated portion where a portion of the primary L2P table is stored, and the read portion of the primary L2P table is cached in the read cache. In the event of a cache hit, the secondary FTL can quickly identify a physical address that corresponds to a logical address to which a host command is directed by accessing the pertinent portion from a chunk of the read cache. Using a read cache in the manner described here reduces cache miss rates.

Storing the primary L2P data in a NAND memory device rather than in DRAM is beneficial in that it allows for a reduced DRAM footprint. This approach to addressing the issue of increasingly large L2P tables is also scalable as NAND densities continue to increase. In addition, storing the primary L2P data in NAND memory uses less FTL metadata budget while also significantly reducing time to ready after boot-up compared to conventional approaches.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include multiple host systems that are coupled to one or more memory sub-systems 110. In some embodiments, the host system 120 is coupled to different types of memory sub-system 110. FIG. 1 illustrates example host system 120 that is coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can be coupled to the memory sub-system 110 via a host interface. Examples of a host interface include, but are not limited to, a SATA interface, a PCIe interface, USB interface, Fibre Channel, Serial Attached SCSI (SAS), Small Computer System Interface (SCSI), a double data rate (DDR) memory bus, a DIMM interface (e.g., DIMM socket interface that supports Double Data Rate (DDR)), Open NAND Flash Interface (ONFI), Double Data Rate (DDR), Low Power Double Data Rate (LPDDR), or any other interface. The host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random-access memory (SDRAM).

Some examples of non-volatile memory devices (e.g., memory device 130) include NAND type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and 3D NAND.

Each of the memory devices 130 can include one or more arrays of memory cells. One type of memory cell, for example, single level cells (SLC), can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. For example, memory cells in NAND memory devices are connected horizontally at their control gates to a word line to form a page. With some types of memory (e.g., NAND), pages can be grouped to form blocks. Additionally, word lines within a memory device can be organized into multiple word line groups, each of which includes one or more word lines, though each word line group includes fewer word lines than are included in a block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), NOR flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special-purpose logic circuitry (e.g., a field programmable gate array (FPGA), an application-specific integrated circuit (ASIC), etc.), or another suitable processor.

The memory sub-system controller 115 can include a processor 117 (processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and the like. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and ECC operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 and convert responses associated with the memory devices 130 and/or the memory device 140 into information for the host system 120.

In some embodiments, the memory devices 130 include local media controller 135 that operates in conjunction with memory sub-system controller 115 to execute operations on one or more memory cells of the memory devices 130.

The memory sub-system 110 also includes a primary flash translation layer (FTL) 113 and a secondary FTL 114. The primary FTL 113 performs lookups and garbage collection. The primary FTL 113 uses a first indirection unit size (e.g., 4 KB) for look-ups. A secondary FTL 114 provides virtual persistent memory for the primary FTL 113 to store a primary L2P table. The primary L2P table is stored in a first portion of the memory device 130 (e.g., an SLC portion of the memory device 130). The primary L2P table includes a mapping between logical addresses and physical addresses in a second portion of the memory device 130 (e.g., a QLC portion). The secondary FTL 114 uses the primary L2P table to process read and write commands from the primary FTL 113 that are directed at the second portion of the memory device 130 (e.g., one or more QLC blocks). The secondary FTL 114 uses a second indirection unit size (e.g., 256 byte) that is smaller than the first indirection unit size used by the primary FTL 113.

When a read or write command directed at a logical address corresponding to the second portion of the memory device 130 is received by the primary FTL 113, the primary FTL 113 sends a look-up request to the secondary FTL 114. In response to the request, the secondary FTL 114 accesses a secondary L2P table from a volatile memory component of the memory sub-system 110 such as DRAM or Holographic random-access memory (HRAM). The secondary L2P table includes a mapping between logical addresses and physical addresses in the first portion of the memory device 130 where the primary L2P table is stored. Accordingly, the secondary FTL 114 uses the secondary L2P table to identify a physical location within the first portion of the memory device 130 that corresponds to a portion of the primary L2P table that includes that a mapping of the logical address to a physical address in the second portion of the memory device 130. The secondary FTL 114 accesses the portion of the primary L2P table to identify the physical address in the second portion of the memory device 130 that corresponds to the location at which data is to be read or written based on the command. The secondary FTL 114 provides the physical address as output to the primary FTL 113, and the primary FTL 113, in turn, executes an operation (e.g., to write, read, or erase data), based on the command, at a physical location in the second portion of the memory device 130 that corresponds to the physical addressed identified by the secondary FTL 114.

In some embodiments, the memory sub-system controller 115 includes at least a portion of the primary and secondary FTLs 113 and 114. For example, the memory sub-system controller 115 can include a processor 117 (processing device) configured to execute instructions stored in local memory 119 for performing the operations described herein. In some embodiments, at least a portion of the primary and secondary FTLs 113 and 114 is part of the host system 120, an application, or an operating system.

Figure 2A:
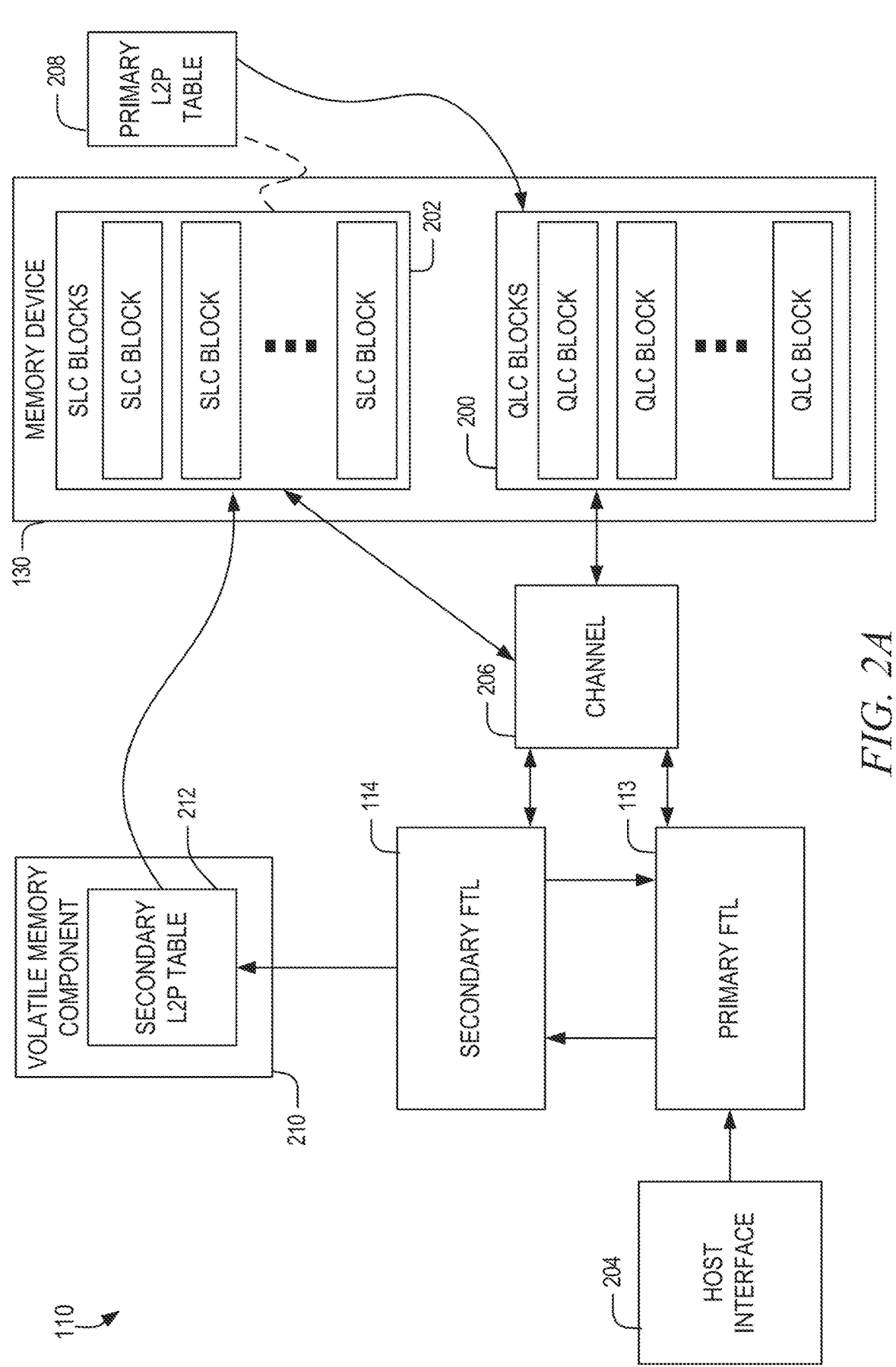
FIGS. 2A and 2B are block diagrams illustrating an example architecture for the memory sub-system, in accordance with some embodiments of the present disclosure.
Figure 2B:
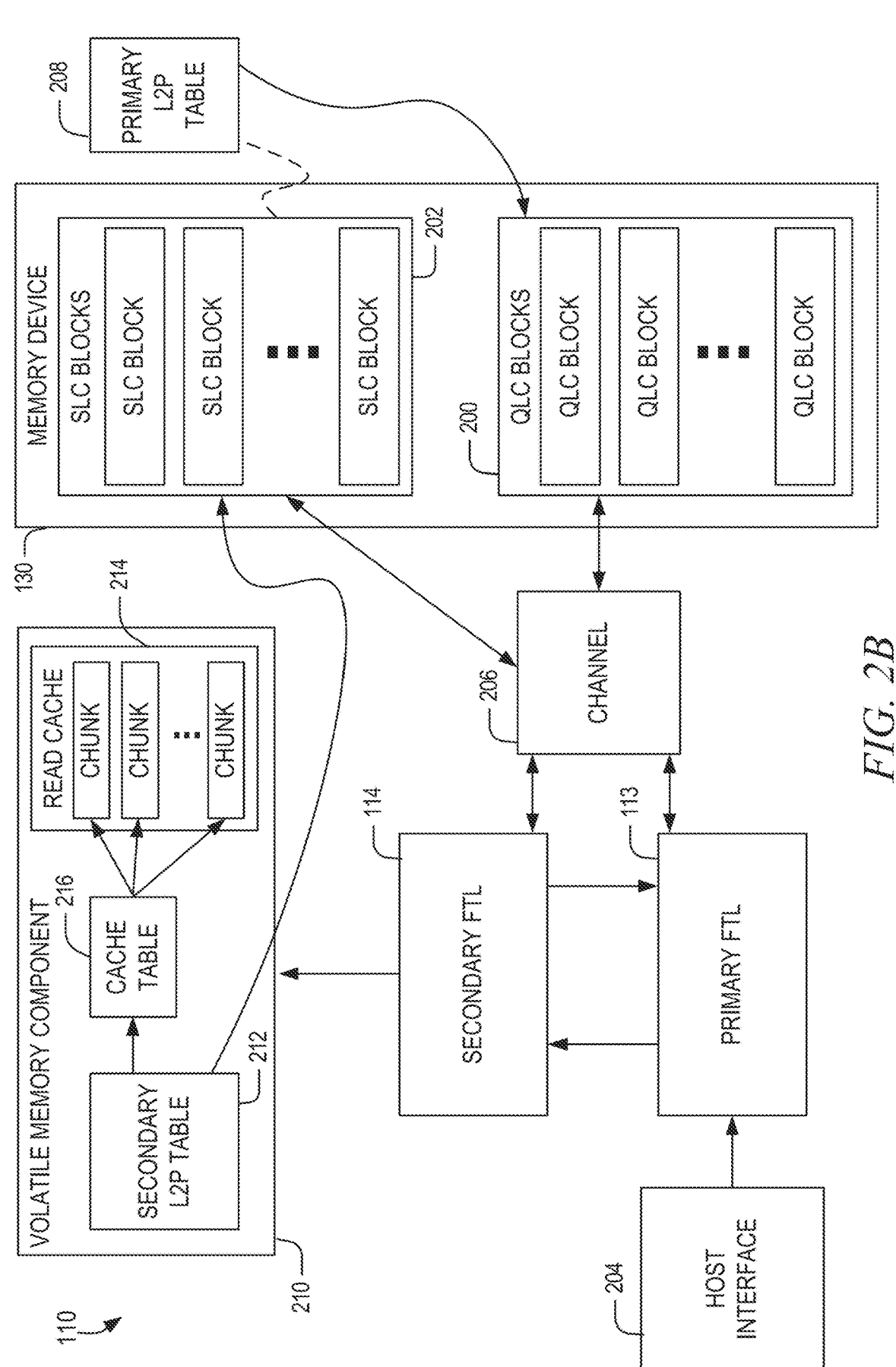

FIGS. 2A and 2B are block diagrams illustrating an example architecture for the memory sub-system 110, in accordance with some embodiments of the present disclosure. In the example illustrated in FIGS. 2A and 2B, the memory device 130 is a NAND memory device that includes multiple memory blocks.

With reference to FIG. 2A, the memory device 130 includes QLC blocks 200 and SLC blocks 202. Specifically, each QLC block 200 includes QLCs and each SLC block 202 includes SLCs. In general, a NAND block includes an array (2D or 3D) of pages (rows) and strings (columns). Each NAND cell includes a transistor, and within each cell, data is stored as the threshold voltage of the transistor. SLC NAND, for example, can store one bit per cell. Other types of memory cells, such as MLCs, TLCs, QLCs, and PLCs can store multiple bits per cell. Strings are connected within the NAND block to allow storage and retrieval of data from selected cells. NAND cells in the same column are connected in series to form a bit line. All cells in a bit line are connected to a common ground on one end and a common sense amplifier on the other for reading the threshold voltage of one of the cells when decoding data. NAND cells are connected horizontally at their control gates to a word line (WL) to form a page. In MLC, TLC, QLC, and PLC NAND, a page is a set of connected cells that share the same word line and is the minimum unit to program.

The memory sub-system 110 further includes a host interface 204 (e.g., NVMe) for the host system 120 to send access requests (e.g., write command, read command) to the memory device 130, such as to store data on the memory device 130 or to read data from the memory device 130.

A backend channel 206 facilitates communication between the NAND blocks (QLC blocks 200 and SLC blocks 202) and the primary FTL 113 as well as the secondary FTL 114. As noted above, the secondary FTL 114 provides virtual persistent memory for the primary FTL 113 to store a primary L2P table 208. The virtual persistent memory is implemented by the SLC blocks 202. That is, the primary L2P table 208 is stored in the SLC blocks 202. The primary L2P table 208 includes a mapping between logical addresses and physical addresses in the QLC blocks 200. The secondary FTL 114 uses the primary L2P table 208 to process read and write commands from the primary FTL 113 that are directed at one or more QLC blocks 200. The secondary FTL 114 uses a second indirection unit size (e.g., 256 byte) that is smaller than the first indirection unit size used by the primary FTL 113.

When a look-up request specifying a logical address corresponding to the QLC blocks 200 is received from the primary FTL 113, the secondary FTL 114 accesses a secondary L2P table 212 to identify a physical location within the SLC blocks 202 at which a corresponding portion of the primary L2P table 208 is stored. The secondary L2P table 212 can be stored in a volatile memory component 210 of the memory sub-system 110 such as DRAM or Holographic random-access memory (HRAM). The volatile memory component 210 may form part of the memory device 130 along with the QLC blocks 200 and the SLC blocks 202 or the volatile memory component 210 can correspond to or form part of another memory device (e.g., the memory device 140). Using the secondary L2P table 212, the secondary FTL 114 identifies a physical address corresponding to the physical location within the SLC blocks 202 and accesses the portion of the primary L2P table 208 to identify a physical address in the QLC blocks 200 that corresponds to the physical location at which data is to be read or written based on the command. The secondary FLT 114 provides the physical address in the QLC blocks 200 to the primary FTL 113, which, in turn, executes a host-initiated operation at the physical location within the QLC blocks 200 that corresponds to the identified physical address.

As shown in FIG. 2B, consistent with some embodiments, the secondary FTL 114 can employ a read cache 214 to aid in performing lookups. The read cache 214 can be implemented in the volatile memory component 210. A read cache table 216 can also be stored in the volatile memory component 210 along with the secondary L2P table 212. The read cache 214 is managed in multiple chunks and each entry in the cache table 216 corresponds to a chunk. The size of each chunk corresponds to the indirection unit size utilized by the secondary L2P table 212. As noted above, in this example, the indirection unit size of the secondary L2P table 212 is 256-byte, and thus, each entry in the cache table 216 corresponds to a 256-byte chunk of the read cache 214. Each chunk of the read cache 214 includes a portion of the primary L2P table 208.

Each entry in the cache table 216 is logically linked to the corresponding chunk of memory in the SLC blocks 202. That is, each entry number in the cache table 216 can be used to calculate a physical address of a corresponding chunk in the SLC blocks 202. Further details regarding use of the read cache table 216 are discussed below.

Figure 3:
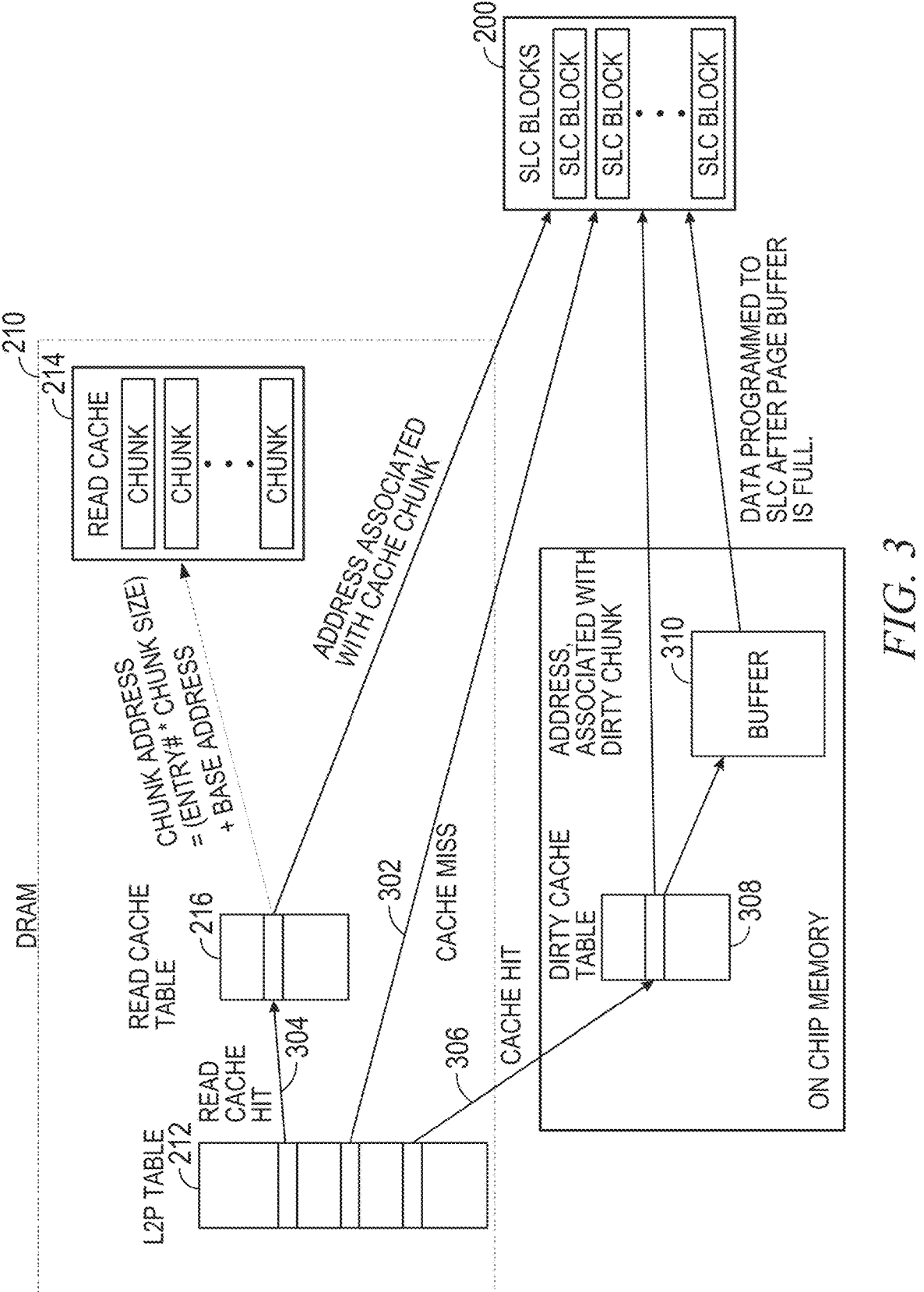
FIG. 3 is a block diagram illustrating an example caching algorithm implemented by the memory sub-system, in accordance with some embodiments of the present disclosure.

FIG. 3 is a block diagrams illustrating an example caching algorithm implemented by the memory sub-system 110, in accordance with some embodiments of the present disclosure. More specifically, FIG. 3 illustrates behavior of the memory sub-system in multiple scenarios—a cache miss at 302, a cache hit at 304, and a dirty cache hit at 306.

With reference to 302, when an entry corresponding to a requested logical address in a host command is not included in the read cache table 216, a cache miss occurs. In the event of a cache miss, the secondary FTL 114 uses the secondary L2P table 212 directly to identify a physical location in the SLC blocks 202 at which a portion of the primary L2P table 208 is stored. The portion of the primary L2P table 208 is cached in the read cache 214 and a new entry is created in the read cache table 216. A physical address in the QLC blocks 200 that corresponds to the logical address in the host command can be identified from the portion of the primary L2P table 208.

If the read cache 214 is full when a cache miss happens, the secondary FTL 114 randomly selects and displaces an entry in the read cache table 216 with the new entry that corresponds to the cache miss. The read cache table 216 is allocated from beginning to end, as the read cache 214 fills up after power on. The new entry in the read cache table 216 is logically linked to the newly cached portion of the primary L2P table 208 in that an address corresponding to the newly cached portion in the read cache 214 can be calculated directly from the entry in the read cache table 216, as will be discussed below.

With reference to 304, when an entry corresponding to a requested logical address in a host command is included in the read cache table 216, a cache hit occurs. In the event of a cache hit, the secondary L2P table 212 points to an entry in the read cache table 216. The secondary FTL 114 calculates an address corresponding to a chunk of the read cache 214 based on an entry number of the entry in the read cache table 216 pointed to by the secondary L2P table 212. The chunk of the read cache 214 includes a portion of the primary L2P table 208 from which a physical location within the QLC blocks 200 can be identified. In an example, the address of a 256-byte chunk in read cache 214 can be calculated as follows: chunk address=cacheTableEntry #*chunksize+baseAddress, where "cacheTableEntry #" is the entry number in the read cache table 216, "chunksize" is the unit size for chunks in the read cache 214, and "baseAddress" corresponds to a logical address specified by a host command. The secondary FTL 114 accesses the chunk of read cache 214 to determine a physical address in the QLC blocks 200 that corresponds to the logical address specified in the host command.

Maintaining the read cache 214 in this manner reduces computational resource utilization (e.g., memory and CPU processing power) compared to traditional approaches. For example, because read cache addresses can be calculated directly from the read cache table 216 entries, there is no need to maintain a least recently used (LRU) list or a list of free entries in the read cache table 216, each of which would require additional memory resources. Further, since there is a fixed mapping between the cache table 216 entries and the actual read cache 214 resources, the need for maintaining forward and backward pointers for each entry is eliminated, thereby reducing the amount of memory resources necessary to store the read cache table 216.

With reference to 306, in the event of a dirty cache hit, the secondary L2P table 212 points to an entry in a dirty cache table 308. The entry in the dirty cache table 308 includes a physical address in the QLC blocks 200 associated with a dirty chunk in the read cache 214. The entry is logically linked to an entry in a buffer 310 where updated data for a corresponding portion of the secondary L2P table 212 is being accumulated. The data from the buffer 310 is programmed to the SLC blocks 202 once the buffer is full.

Figure 4:
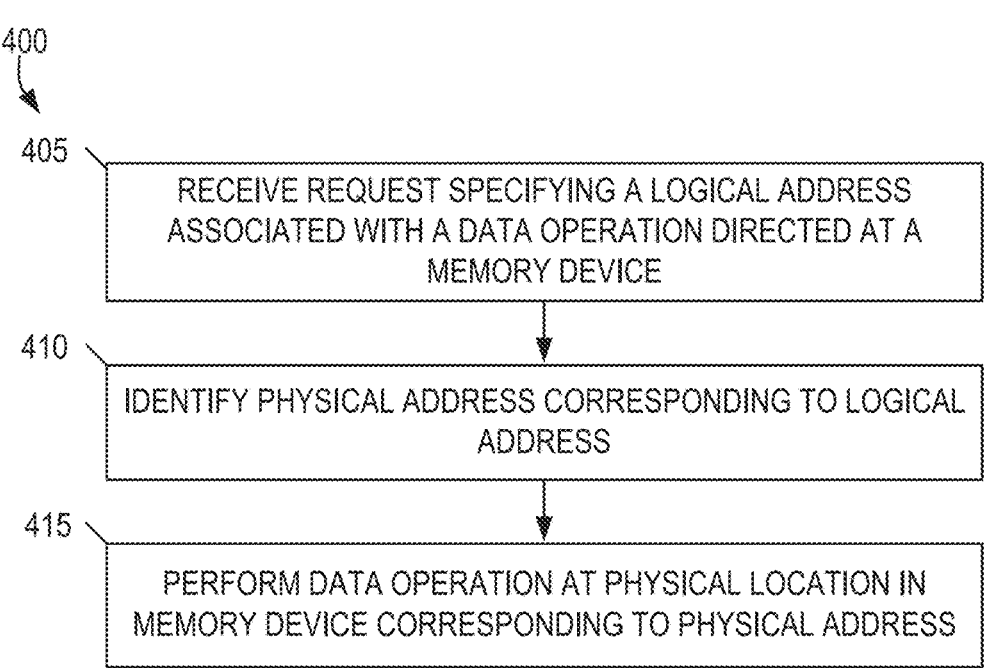
Figure 6:
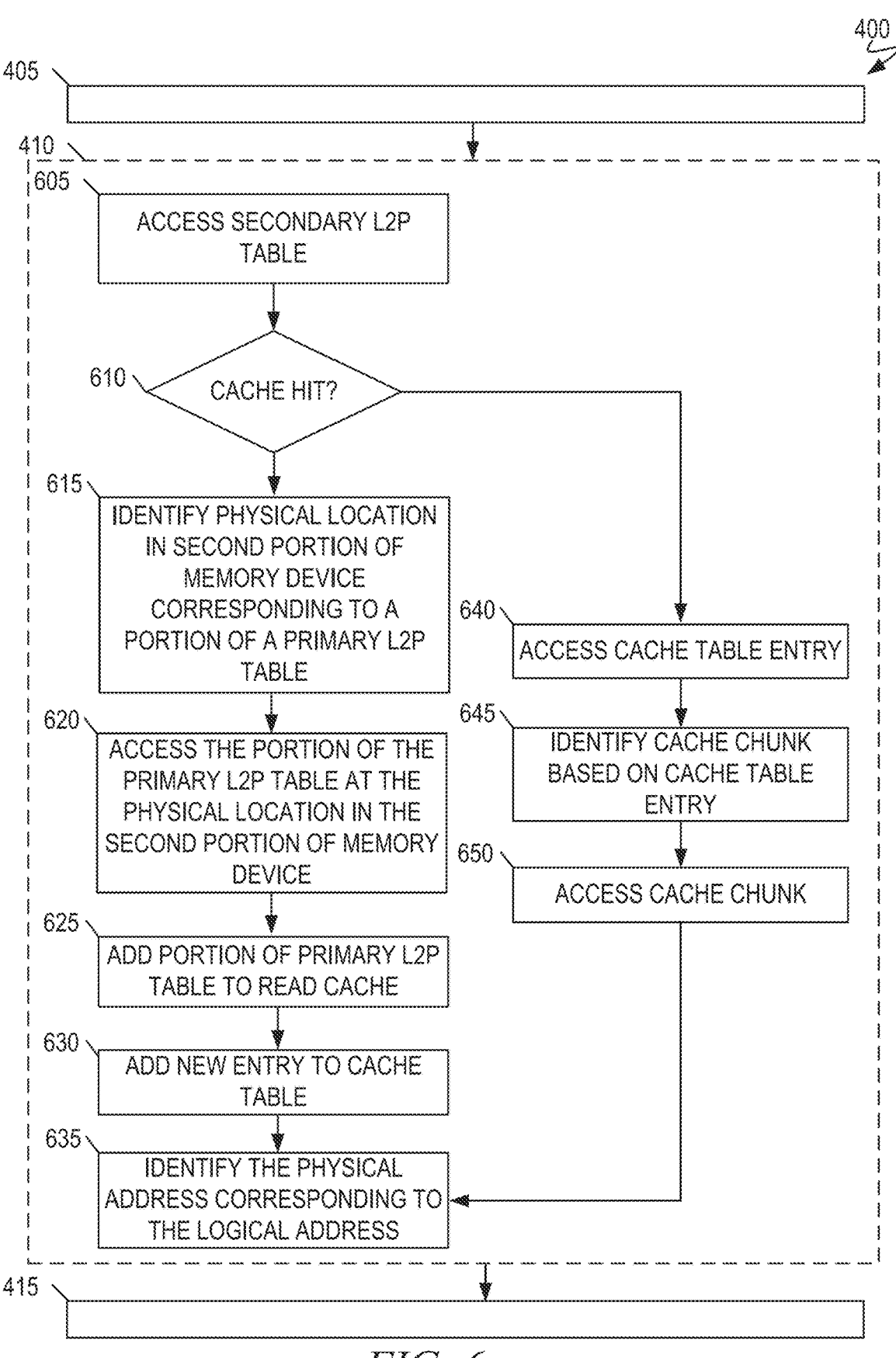

FIGS. 4-6 are flow diagrams illustrating an example method 400 for programming data to a memory device by communicating indicators of target charge levels to the memory device, in accordance with some embodiments of the present disclosure. The method 400 can be performed by a processing device that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the processing device includes the primary FTL 113 and the secondary FTL 114 of FIG. 1. Consistent with these embodiments, any one or more operations of the method 400 can be performed by the primary FTL 113 or secondary FTL 114. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are made use of in every embodiment. Other process flows are possible.

At operation 405, the processing device receives a request specifying a logical address associated with a host-initiated data operation (e.g., a read, write, or erase) directed at a memory device (e.g., the memory device 130). The request can include or be based on an access request (e.g., write command, read command) received from a host system (e.g., the host system 120). The logical address is specified by the access request from the host system.

In some embodiments, the memory device is a NAND memory device that includes at least an SLC portion and a QLC portion. That is, the memory device includes SLC blocks and QLC blocks. In these embodiments, the logical address can correspond to a physical location within the QLC portion of the memory device.

The processing device identifies a physical location within a first portion of the memory device that corresponds to the logical address included in the request (operation 410). The physical location corresponds to a physical address determined by the processing device from a primary L2P table. In embodiments in which the memory device is a NAND memory device, the processing device identifies a physical location within the QLC portion of the memory device that corresponds to a physical address determined from the logical address.

In some embodiments, a primary FTL of the processing device receives the request associated with the host-initiated data operation and a secondary FTL is responsible for identifying the physical address in the first portion of the memory device. Consistent with these embodiments, the primary FTL can generate and provide a look-up request to the secondary FTL that includes the logical address, and the secondary FTL can provide the physical address to the primary FTL responsive to the look-up request. Further details regarding the operations performed by the secondary FTL are discussed below in reference to FIG. 5.

The processing device, at operation 415, performs the host-initiated data operation at the physical location in the first portion of the memory device. For example, the processing device can read data from or write data to the physical location.

As shown in FIG. 5, the method 400 can, in some embodiments, include operations 505, 510, 515, 520, and 525. Consistent with these embodiments, the operations 505, 510, 515, 520, and 525 can be performed as part of the operation 410 where the processing device identifies the physical location corresponding to the logical address in the request. In some embodiments, the operations 505, 510, 515, 520, and 525 are performed by the secondary FTL of the processing device in response to receiving a look-up request generated by the primary FTL based on an access request received by the primary FTL from the host system.

At operation 505, the processing device accesses a secondary L2P table (e.g., the secondary L2P table 212) stored in a volatile memory component (e.g., volatile memory component 210). The secondary L2P table includes a mapping between logical addresses and physical addresses within a second portion of the memory device that is dedicated for storing the primary L2P table (e.g., the primary L2P table 208). The primary L2P table includes a mapping between logical addresses and physical addresses within the first portion of the memory device to which host-initiated operations are directed (e.g., the portion of the memory device that stores user data). The primary L2P table uses a first indirection size (e.g., 4 KB) while the secondary L2P table uses a second indirection size (e.g., 256-byte) that is smaller than the first indirection size.

In embodiments in which the memory device is a NAND memory device with SLC portions and QLC portions, the secondary L2P table includes a mapping between logical addresses and physical addresses within the SLC portion of the memory device, in which the primary L2P table is stored. Consistent with these embodiments, the primary L2P table includes a mapping between logical addresses and physical addresses within the QLC portion of the memory device.

The processing device identifies a physical location within the second portion of the memory device that corresponds to a portion of the primary L2P table associated with the logical address in the request (operation 510). That is, the portion of the primary L2P table specifies a physical address within the first portion of the memory device that corresponds to the logical address in the request. In some embodiments, the processing device determines the physical location within the second portion of the memory device based on a physical address specified by the secondary L2P table. In some embodiments, the processing device determines the physical location within the second portion of the memory device based on data read from a read cache.

In an example of the forgoing operation, the processing device identifies a physical location within the SLC portion of the memory device that corresponds to a portion of the primary L2P table in which a mapping between the logical address and a physical address in the QLC portion of the memory device is provided. In this example, the processing device identifies the physical location within the SLC portion based on a physical address specified by the secondary L2P table.

The processing device, at operation 515, accesses the portion of the primary L2P table from the physical location in the second portion of the memory device. At operation 520, the processing device identifies a physical address in the first portion of the memory device that corresponds to the logical address specified by the request based on the portion of the primary L2P table accessed from the physical location in the second portion of the memory device. The accessed portion of the primary L2P table includes the mapping of the logical address to the physical address in the first portion of the memory device. In an example of the forgoing operation, the processing device identifies a physical address in the QLC portion of the memory device using the portion of the primary L2P table accessed from the SLC portion of the memory device.

The processing device provides the physical address as output, at operation 525. In an example, the secondary FTL of the processing device provides the physical address as output to the primary FTL to perform the host-initiated operation (write, read, or erase) at the physical location in the memory device (operation 415).

As shown in FIG. 6, the method 400 can include operations 605, 610, 615, 620, 625, 630, 635, 640, 645, and 650, in some embodiments. Consistent with some embodiments, the operations 605 can be performed as part of operation 410 where the processing device identifies a physical address corresponding to the logical address specified by the request.

At operation 605, the processing device accesses a secondary L2P table (e.g., the secondary L2P table 212) stored in a volatile memory component (e.g., volatile memory component 210). The secondary L2P table includes a mapping between logical addresses and physical addresses within a second portion of the memory device that is dedicated for storing the primary L2P table (e.g., the primary L2P table 208). The primary L2P table includes a mapping between logical addresses and physical addresses within the first portion of the memory device to which host-initiated operations are directed (e.g., the portion of the memory device that stores user data).

The processing device, at operation 610, determines whether a corresponding entry in the secondary L2P table points to an entry in a read cache table associated with a read cache. The read cache and read cache table can be maintained in volatile memory component (e.g., DRAM) along with the secondary L2P table.

Consistent with these embodiments, if the processing device determines that the entry in the secondary L2P tables does not point to a read cache table entry a cache miss has occurred, and the processing device identifies a physical location within the second portion of the memory device that corresponds to a portion of the primary L2P table associated with the logical address in the request (operation 615). That is, the portion of the primary L2P table specifies a physical address within the first portion of the memory device that corresponds to the logical address in the request. The processing device determines the physical location within the second portion of the memory device based on a physical address specified by the secondary L2P table.

The processing device, at operation 620, accesses the portion of the primary L2P table from the physical location in the second portion of the memory device and the processing device caches the accessed portion of the primary L2P table, at operation 625. That is, the processing devices adds the portion of the L2P table to a chunk of the read cache. The portion of the primary L2P table includes the mapping of the logical address to the physical address in the first portion of the memory device.

At operation 630, the processing device adds a new entry to the read cache table corresponding to the portion of the L2P table added to the chunk of the read cache. The read cache table is allocated from beginning to end, as the cache fills up after power on. If the read cache table is full, the processing device randomly selects an existing entry in the read cache table and replaces it with the new entry.

Returning to operation 610, if the processing device determines that the entry in the secondary L2P tables does point to a read cache table entry, a cache hit occurs, and the processing device accesses the read cache table entry, at operation 640.

The processing device identifies a chunk of read cache from among multiple chunks of the read cache based on the cache table entry, at operation 645. The size of each chunk corresponds to an indirection size used by the secondary L2P table (e.g., 256-byte). To identify the chunk, the processing device calculates a chunk address based on an entry number of the table entry. As an example, the processing device can calculate the chunk address by multiplying the entry number by a size of each chunk and adding the product to the logical address specified by the request. As addressed above, by calculating the chunk address directly from the entry, the processing device can eliminate a need for maintaining a least recently used (LRU) policy or a pool of free entries.

The processing device accesses the identified cache chunk, at operation 650. The identified cache chunk includes the portion of the primary L2P table that specifies the physical address mapping (within the first portion of the memory device) for the logical address specified by the request.

At operation 635, the processing device identifies the physical address in the first portion of the memory device that corresponds to the logical address specified by the request based on the portion of the primary L2P table accessed from the physical location in the second portion of the memory device (at operation 620) or based on the portion of the primary L2P table accessed from the chunk of the read cache (at operation 650). In an example, the processing device identifies a physical address in a QLC portion of the memory device that corresponds to the logical address specified in the request. In the event of a cache miss, the processing device identifies the physical address from the primary L2P table accessed from a SLC portion of the memory device. In the event of a cache hit, the processing device identifies the physical address from the chunk of the read cache implemented in volatile memory (e.g., DRAM or HRAM).

Described implementations of the subject matter can include one or more features, alone or in combination as illustrated below by way of example.

Example 1 is a system including: a memory device comprising a first portion and a second portion, the second portion storing a first logical to physical (L2P) table comprising a mapping between logical addresses and physical addresses in the first portion of the memory device; and a processing device coupled to the memory device, the processing device configured to perform operations comprising: receiving a request specifying a logical address associated with a host-initiated operation directed at the first portion of the memory device; accessing, from a volatile memory component, a second L2P table comprising a mapping between logical addresses and physical addresses in the second portion of the memory device; identifying, based on the second L2P table, a physical location within the second portion of the memory device, the physical location within the second portion of the memory device corresponding to a portion of the first L2P table that specifies a physical address within the first portion of the memory device that corresponds to the logical address; identifying, based on the portion of the first L2P table, the physical address within the first portion of the memory device that corresponds to the logical address; and performing the host-initiated operation at the physical address within the first portion of the memory device that corresponds to the logical address specified by the request.

Example 2 includes the system of Example 1 wherein: the memory device is a NAND memory device; the first portion comprises multiple quad-level cells (QLCs); and the second portion comprises multiple single level cells (SLCs).

Example 3 includes the system of any one or more of Examples 1 or 2, wherein: the first L2P table uses a first indirection unit size; and the second L2P table uses a second indirection unit size.

Example 4 includes the system of any one or more of Examples 1-3, wherein the second indirection unit size is smaller than the first indirection unit size.

Example 5 includes the system of any one or more of Examples 1-4, wherein the operations further comprise: accessing the portion of the first L2P table from the physical location within the second portion of the memory device.

Example 6 includes the system of any one or more of Examples 1-5, wherein the operations further comprise determining whether an entry in the second L2P table points to a read cache table, wherein the portion of the first L2P table is accessed from the physical location within the second portion of the memory device based on determining the entry in the second L2P table does not point to the read cache table.

Example 7 includes the system of any one or more of Examples 1-6, further comprising a read cache comprising multiple chunks to cache portions of the first L2P table, wherein the operations further comprise adding the accessed portion of the first L2P table to the read cache based on determining the entry in the second L2P table does not point to the read cache table.

Example 8 includes the system of any one or more of Examples 1-7, wherein the operations further comprise adding an entry to the read cache table corresponding to the accessed portion of the first L2P table added to the read cache.

Example 9 includes the system of any one or more of Examples 1-8, wherein the host-initiated operation comprises one of: a read operation, a write operation, or an erase operation.

Example 10 includes the system of any one or more of Examples 1-9, wherein the volatile memory component comprises one of: dynamic random-access memory (DRAM) or holographic random-access memory (HRAM).

Example 11 is a method comprising: receiving, at a processing device, a request specifying a logical address associated with a host-initiated operation directed at a first portion of a memory device, the memory device comprising the first portion and a second portion, the second portion storing a first logical to physical (L2P) table comprising a mapping between logical addresses and physical addresses in the first portion of the memory device; accessing, from a volatile memory component, a second L2P table comprising a mapping between logical addresses and physical addresses in the second portion of the memory device; identifying, based on the second L2P table, a physical location within the second portion of the memory device, the physical location within the second portion of the memory device corresponding to a portion of the first L2P table that specifies a physical address within the first portion of the memory device that corresponds to the logical address; accessing the portion of the first L2P table from the physical location within the second portion of the memory device; identifying, based on the portion of the first L2P table, the physical address within the first portion of the memory device that corresponds to the logical address; and performing, by the processing device, the host-initiated operation at the physical address within the first portion of the memory device that corresponds to the logical address specified by the request.

Example 12 includes the method of any one or more of Example 11, wherein: the memory device is a NAND memory device; the first portion comprises multiple quad-level cells (QLCs); and the second portion comprises multiple single level cells (SLCs).

Example 13 includes the method of any one or more of Examples 11-12, wherein: the first L2P table uses a first indirection unit size; and the second L2P table uses a second indirection unit size.

Example 14 includes the method of any one or more of Examples 11-13, wherein the second indirection unit size is smaller than the first indirection unit size.

Example 15 includes the method of any one or more of Examples 11-14, further comprising determining whether an entry in the second L2P table points to a read cache table, wherein the portion of the first L2P table is accessed from the physical location within the second portion of the memory device based on determining the entry in the second L2P table does not point to the read cache table.

Example 16 includes the method of any one or more of Examples 11-15, further comprising a read cache comprising multiple chunks to cache portions of the first L2P table, wherein the operations further comprise adding the accessed portion of the first L2P table to the read cache based on determining the entry in the second L2P table does not point to the read cache table.

Example 17 includes the method of any one or more of Examples 11-16, wherein the operations further comprise adding an entry to the read cache table corresponding to the accessed portion of the first L2P table added to the read cache.

Example 18 includes the method of any one or more of Examples 11-17, wherein the host-initiated operation comprises one of: a read operation, a write operation, or an erase operation.

Example 19 includes the method of any one or more of Examples 11-18, wherein the volatile memory component comprises one of: dynamic random-access memory (DRAM) or holographic random-access memory (HRAM).

Example 20 is a computer-readable storage medium comprising instructions that, when executed by a processing device, configure the processing device to perform operations comprising: receiving a request specifying a logical address associated with a host-initiated operation directed at a first portion of a memory device, the memory device comprising the first portion and a second portion, the second portion storing a first logical to physical (L2P) table comprising a mapping between logical addresses and physical addresses in the first portion of the memory device; accessing, from a volatile memory component, a second L2P table comprising a mapping between logical addresses and physical addresses in the second portion of the memory device; identifying, based on the second L2P table, a physical location within the second portion of the memory device, the physical location within the second portion of the memory device corresponding to a portion of the first L2P table that specifies a physical address within the first portion of the memory device that corresponds to the logical address; accessing the portion of the first L2P table from the physical location within the second portion of the memory device; identifying, based on the portion of the first L2P table, the physical address within the first portion of the memory device that corresponds to the logical address; and performing the host-initiated operation at the physical address within the first portion of the memory device that corresponds to the logical address specified by the request.

Figure 7:
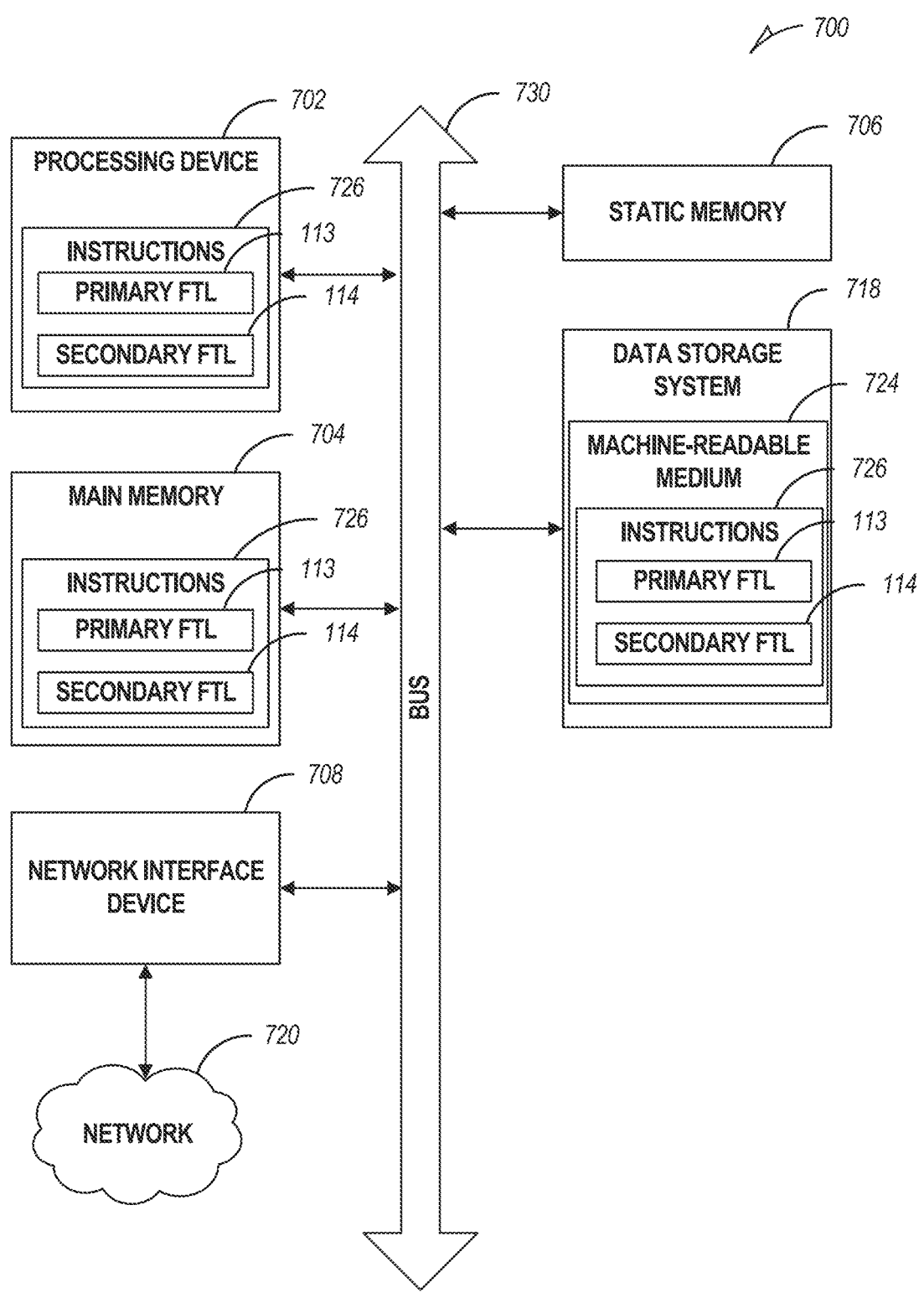
FIG. 7 is a block diagram of an example computer system in which embodiments of the present disclosure may operate.

FIG. 7 illustrates an example machine in the form of a computer system 700 within which a set of instructions can be executed for causing the machine to perform any one or more of the methodologies discussed herein. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to primary FTL 113 or secondary FTL 114 of FIG. 1). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., ROM, flash memory, DRAM such as SDRAM or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device 702 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an ASIC, a FPGA, a digital signal processor (DSP), network processor, or the like. The processing device 702 is configured to execute instructions 726 for performing the operations and steps discussed herein. The computer system 700 can further include a network interface device 708 to communicate over a network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to an FTL (e.g., the primary FTL 113 or secondary FTL 114 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, ROMs, RAMS, EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, etc.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

18

What is claimed is:

1. A system comprising:
a memory device comprising a first portion and a second portion, the second portion storing a first logical to physical (L2P) table comprising a mapping between logical addresses and physical addresses in the first portion of the memory device; and
a processing device coupled to the memory device, the processing device comprising a primary flash translation layer (FTL) and a secondary FTL, the primary FTL configured to perform operations comprising:
receiving a request specifying a logical address associated with a host-initiated operation directed at the first portion of the memory device;
providing a look-up request to the secondary FTL based on the request, the look-up request specifying the logical address;
the secondary FTL configured to perform operations comprising:
identifying, based on the first L2P table, the physical address within the first portion of the memory device that corresponds to the logical address; and
providing the physical address to the primary FTL responsive to the look-up request, the primary FTL further configured to execute the host-initiated operation at the physical address within the first portion of the memory device that corresponds to the logical address specified by the request.

2. The system of claim 1, wherein:
the physical address within the first portion of the memory device is a first physical address;
the operations comprise identifying a second physical address corresponding to a physical location within the second portion of the memory device, the physical location within the second portion of the memory device corresponding to a portion of the first L2P table that specifies the first physical address.

3. The system of claim 2, wherein the operations further comprise:
accessing the portion of the first L2P table from the physical location within the second portion of the memory device.

4. The system of claim 3, further comprising a read cache comprising multiple chunks to cache portions of the first L2P table, wherein the operations further comprise adding the accessed portion of the first L2P table to the read cache based on determining an entry in a second L2P table does not point to the read cache table.

5. The system of claim 4, wherein a size of each chunk in the multiple chunks corresponds to an indirection unit size of the second L2P table.

6. The system of claim 5, wherein:
the indirection size of the second L2P table is a first indirection unit size;
the first L2P table uses a second indirection unit size.

7. The system of claim 6, wherein the first indirection unit size is smaller than the second indirection unit size.

8. The system of claim 4, wherein the second L2P table is stored in one of: dynamic random-access memory (DRAM) or holographic random-access memory (HRAM).

9. The system of claim 1, wherein the operations further comprise adding a new entry to a read cache table that is logically linked to a chunk of read cache in which the portion of the first L2P table is cached, wherein the adding of the new entry to the read cache table comprises:
randomly selecting an existing entry in the read cache table; and replacing the existing entry in the read cache table with the new entry.

10. The system of claim 1, wherein the host-initiated operation comprises one of: a read operation, a write operation, or an erase operation.

11. A method comprising:

receiving, at a primary flash translation layer (FTL) of a memory sub-system controller, a request specifying a logical address associated with a host-initiated operation directed at a first portion of a memory device, the memory device comprising the first portion and a second portion, the second portion storing a first logical to physical (L2P) table comprising a mapping between logical addresses and physical addresses in the first portion of the memory device;

providing, by the primary FTL, a look-up request to a secondary FTL of the memory sub-system controller based on the request, the look-up request specifying the logical address;

identifying, by the secondary FTL, based on the first L2P table, the physical address within the first portion of the memory device that corresponds to the logical address;

providing, by the secondary FTL, the physical address to the primary FTL responsive to the look-up request; and performing, by the primary FTL, the host-initiated operation at the physical address within the first portion of the memory device that corresponds to the logical address specified by the request.

12. The method of claim 11, wherein:

the physical address within the first portion of the memory device is a first physical address;

the method comprises identifying a second physical address corresponding to a physical location within the second portion of the memory device, the physical location within the second portion of the memory device corresponding to a portion of the first L2P table that specifies the first physical address.

13. The method of claim 12, further comprising a read cache comprising multiple chunks to cache portions of the first L2P table, wherein the operations further comprise adding the portion of the first L2P table to the read cache based on determining an entry in a second L2P table does not point to the read cache table.

14. The method of claim 13, wherein a size of each chunk in the multiple chunks corresponds to an indirection size of the second L2P table.

15. The method of claim 14, wherein:

the indirection size of the second L2P table is a first indirection unit size;

the first L2P table uses a second indirection unit size.

16. The method of claim 15, wherein the first indirection unit size is smaller than the second indirection unit size.

17. The method of claim 13, wherein the second L2P table is stored in one of: dynamic random-access memory (DRAM) or holographic random-access memory (HRAM).

18. The method of claim 11, further comprising adding a new entry to a read cache table that is logically linked to a chunk of read cache in which the portion of the first L2P table is cached, wherein the adding of the new entry to the read cache table comprises:

randomly selecting an existing entry in the read cache table; and replacing the existing entry in the read cache table with the new entry.

19. The method of claim 11, wherein the host-initiated operation comprises one of: a read operation, a write operation, or an erase operation.

20. A computer-readable storage medium comprising instructions that, when executed by a processing device, configure the processing device to perform operations comprising:

receiving, at a primary flash translation layer (FTL) of a memory sub-system controller, a request specifying a logical address associated with a host-initiated operation directed at a first portion of a memory device, the memory device comprising the first portion and second portion, the second portion storing a first logical to physical (L2P) table comprising a mapping between logical addresses and physical addresses in the first portion of the memory device;

providing, by the primary FTL, a look-up request to a secondary FTL of the memory sub-system controller based on the request, the look-up request specifying the logical address;

identifying, by the secondary FTL, based on the first L2P table, the physical address within the first portion of the memory device that corresponds to the logical address;

providing, by the secondary FTL, the physical address to the primary FTL responsive to the look-up request; and performing, by the primary FTL, the host-initiated operation at the physical address within the first portion of the memory device that corresponds to the logical address specified by the request.

* * * * *